(12) United States Patent
Nitzan

(10) Patent No.: US 9,781,829 B2
(45) Date of Patent: Oct. 3, 2017

(54) SURFACE PRETREATMENT AND DROP SPREADING CONTROL ON MULTI COMPONENT SURFACES

(71) Applicant: CAMTEK LTD., Migdal-Haemek (IL)

(72) Inventor: Boaz Nitzan, Sde Warburg (IL)

(73) Assignee: CAMTEL LTD., Migdal Haemeq (IL)

( * ) Notice: Subject to any disclaimer, the term of this patent is extended or adjusted under 35 U.S.C. 154(b) by 0 days.

(21) Appl. No.: 14/761,380

(22) PCT Filed: Jan. 21, 2014

(86) PCT No.: PCT/IL2014/050066
§ 371 (c)(1),
(2) Date: Jul. 16, 2015

(87) PCT Pub. No.: WO2014/111942
PCT Pub. Date: Jul. 24, 2014

(65) Prior Publication Data
US 2015/0359094 A1   Dec. 10, 2015

Related U.S. Application Data

(60) Provisional application No. 61/754,718, filed on Jan. 21, 2013.

(51) Int. Cl.
*B32B 3/02* (2006.01)
*H05K 1/05* (2006.01)
(Continued)

(52) U.S. Cl.
CPC .......... *H05K 1/056* (2013.01); *B41J 11/0015* (2013.01); *B41M 5/0011* (2013.01); *H01L 21/306* (2013.01); *H05K 3/3452* (2013.01); *H05K 3/38* (2013.01); *H05K 2203/013* (2013.01); *H05K 2203/122* (2013.01); *Y10T 428/24802* (2015.01)

(58) Field of Classification Search
CPC ........ H01L 21/306; H05K 1/056; H05K 3/38; H05K 3/3452; H05K 2203/122; B41M 5/0011; B41J 11/0015; Y10T 428/24802
See application file for complete search history.

(56) References Cited

U.S. PATENT DOCUMENTS

2003/0003231 A1   1/2003   Kiguchi
2003/0232128 A1   12/2003  Furusawa
(Continued)

*Primary Examiner* — Elizabeth Mulvaney
(74) *Attorney, Agent, or Firm* — Reches Patents

(57) ABSTRACT

Methods, systems and produced printed substrates are provided, which include substrates composed of one or more materials which are treated by an intermediate layer for normalizing surface energies and a digitally printed formulation adapted to the normalized surface energies. Surface energy normalization may be carried out by physical processes or by selective chemical processes. In an example, a self-assembled monolayer is applied to the surface of a printed circuit board to control ink jet dots by reducing copper surface energy and to improve ink adhesion. The self-assembled monolayer binds via an α group selectively and covalently to the copper on the board and binds via a hydrophobic ω group to solder mask ink that is applied to the board. The ω group participates in the solidification process of the ink.

17 Claims, 6 Drawing Sheets

(51) Int. Cl.
*B41M 5/00* (2006.01)
*B41J 11/00* (2006.01)
*H01L 21/306* (2006.01)
*H05K 3/34* (2006.01)
*H05K 3/38* (2006.01)

(56) References Cited

U.S. PATENT DOCUMENTS

| | | | |
|---|---|---|---|
| 2004/0241451 A1* | 12/2004 | Clark | B41M 3/006 |
| | | | 428/421 |
| 2006/0046069 A1 | 3/2006 | Jung | |
| 2006/0159838 A1 | 7/2006 | Kowalski et al. | |
| 2008/0032109 A1* | 2/2008 | Leising | C23C 22/02 |
| | | | 428/220 |
| 2010/0080957 A1* | 4/2010 | Chinn | B05D 5/00 |
| | | | 428/147 |
| 2010/0230696 A1 | 9/2010 | Fukunaga | |
| 2011/0183123 A1* | 7/2011 | Buck | B81C 1/00206 |
| | | | 428/195.1 |
| 2012/0217165 A1 | 8/2012 | Feng | |
| 2012/0314007 A1 | 12/2012 | Shimofuku | |

* cited by examiner

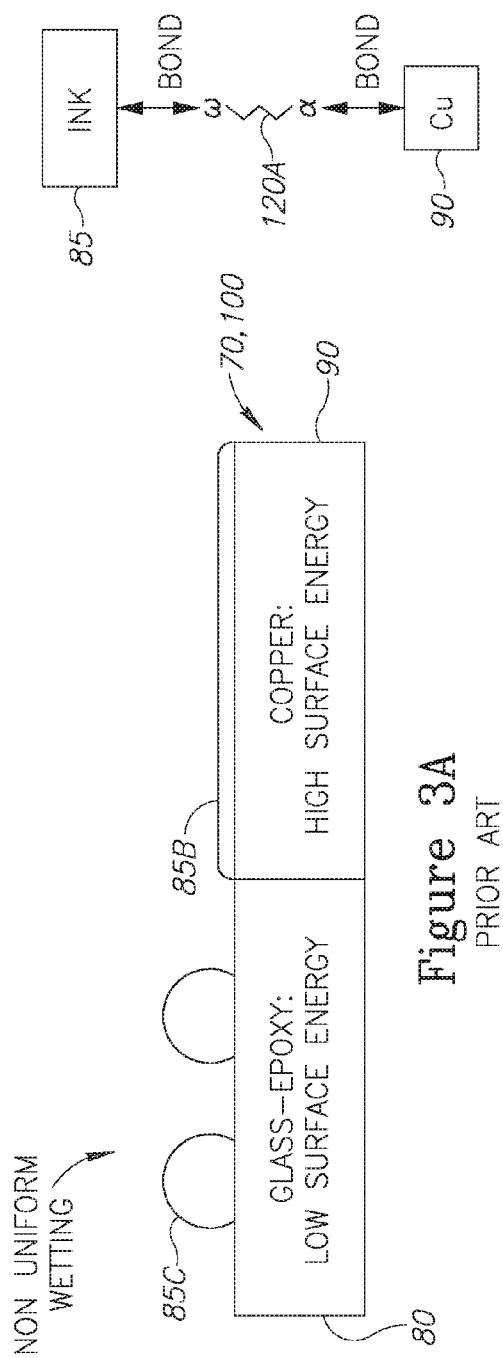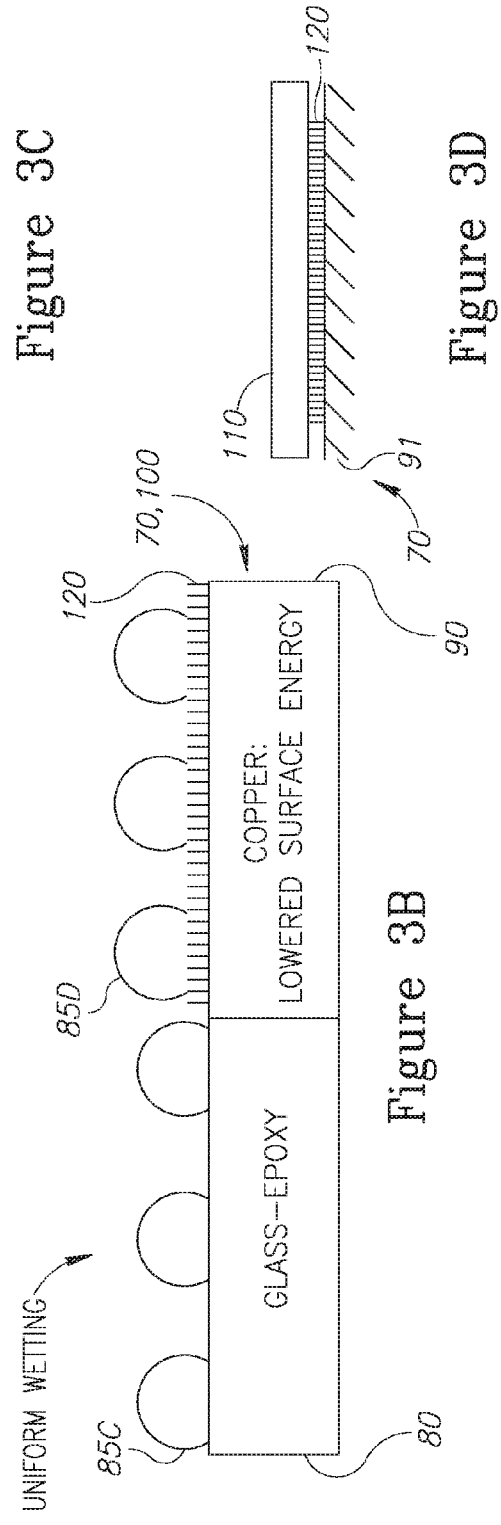

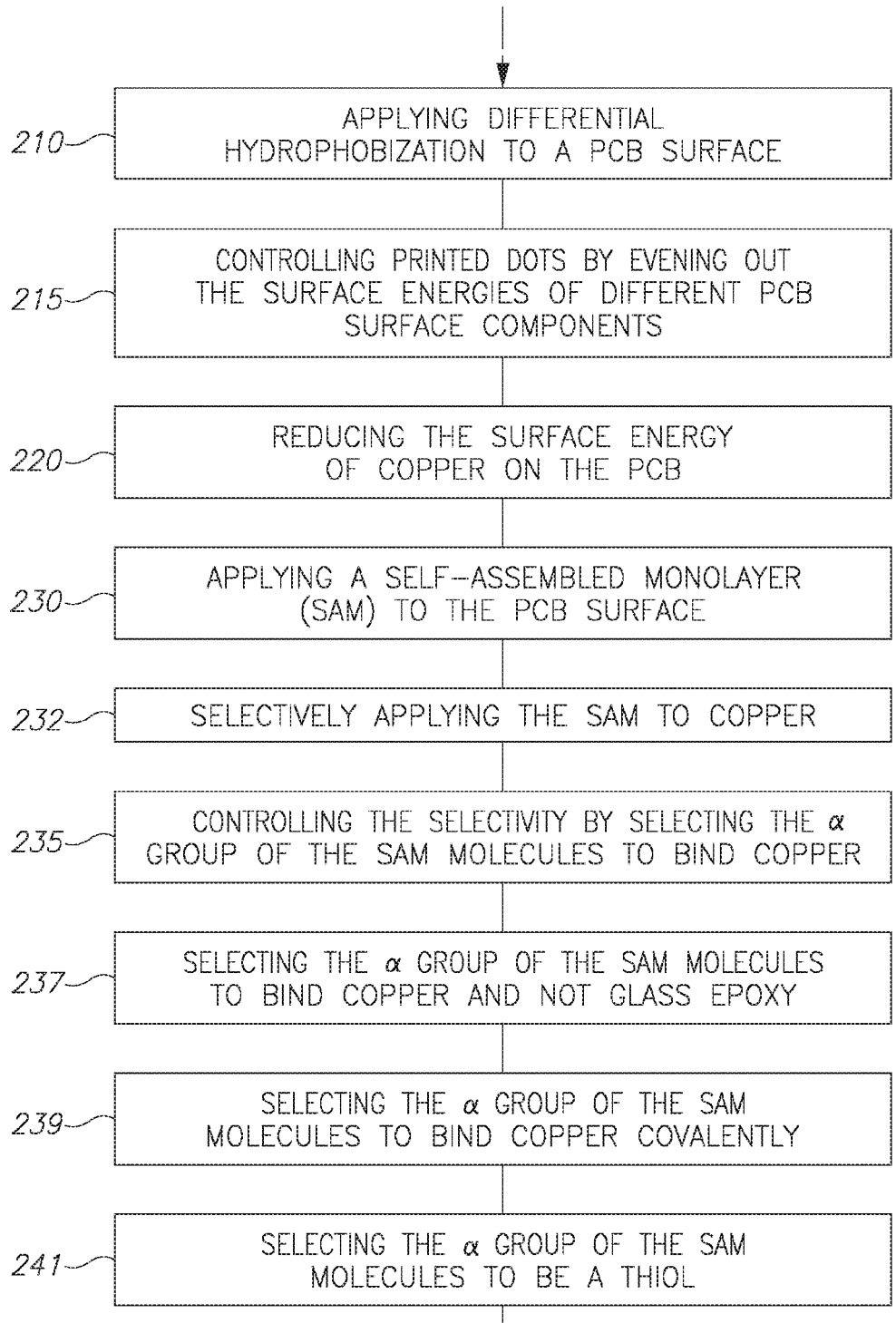
Figure 4 (cont. 1)

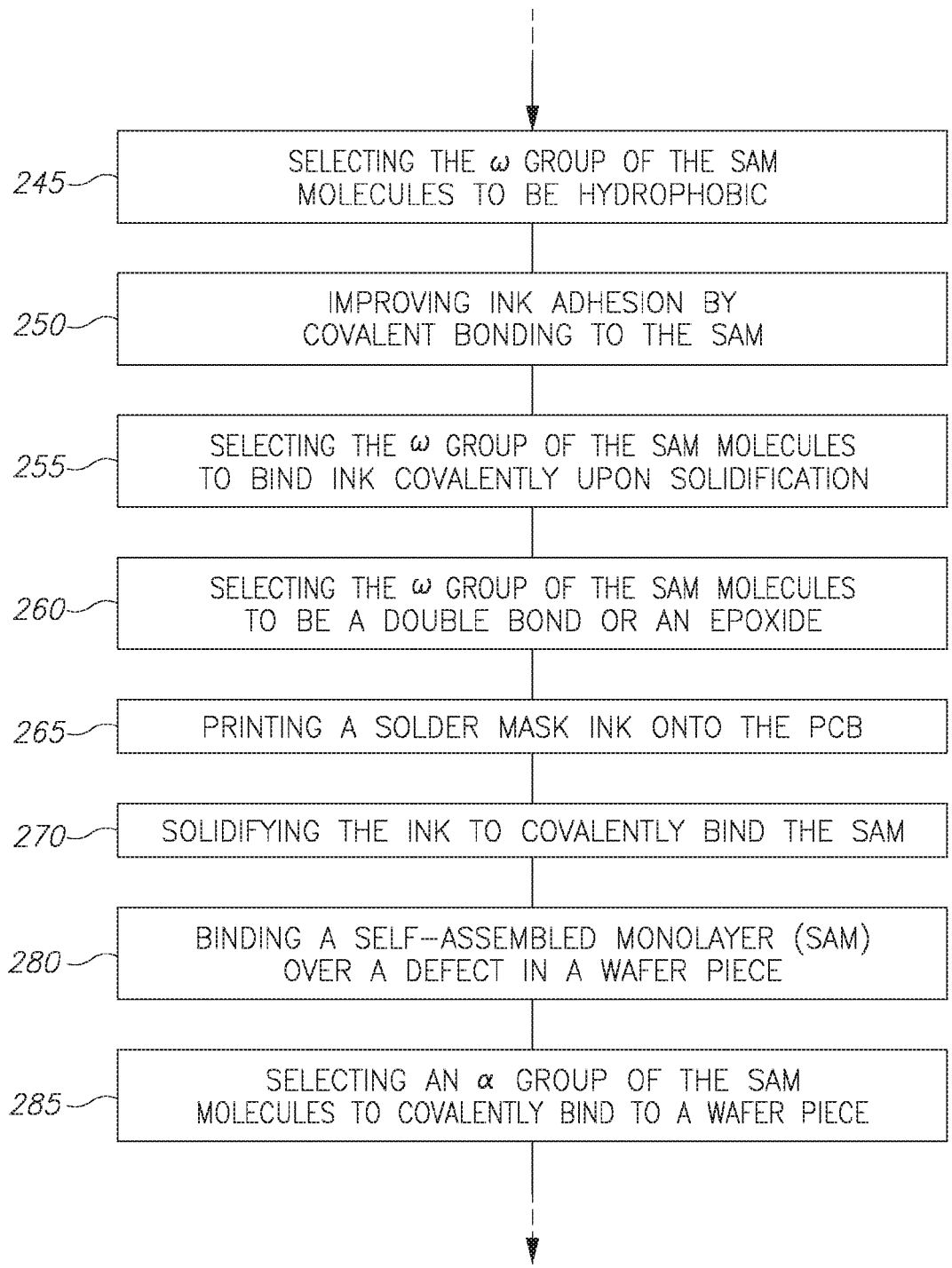
Figure 4 (cont. 2)

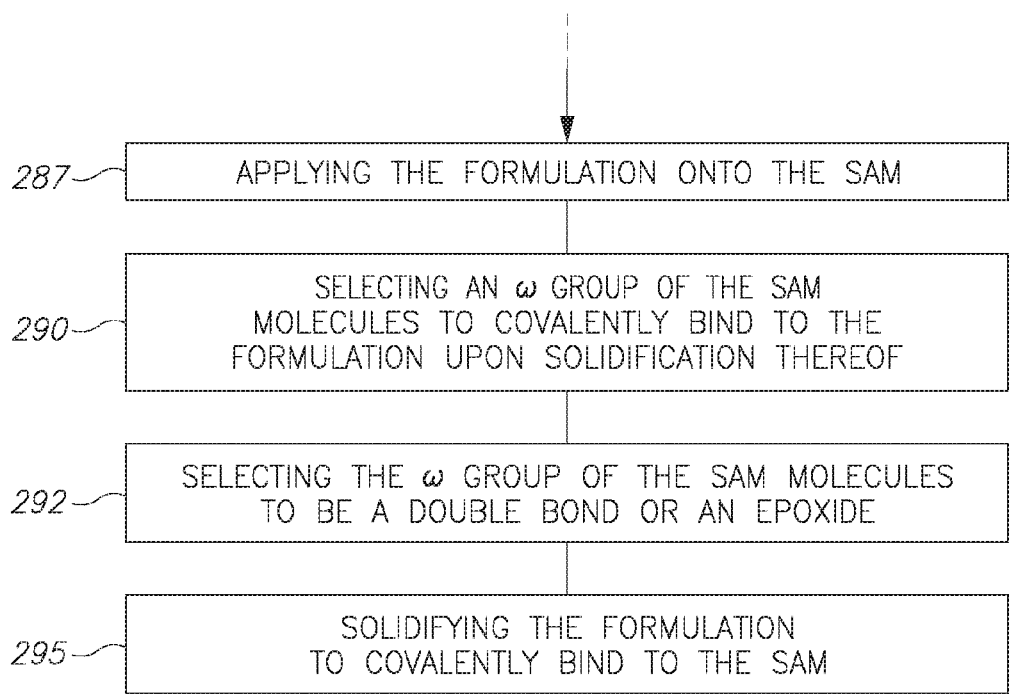
Figure 4 (cont. 3)

SURFACE PRETREATMENT AND DROP SPREADING CONTROL ON MULTI COMPONENT SURFACES

BACKGROUND

1. Technical Field

The present invention relates to the field of digital printing, and more particularly, to surface treatments that improve digital printing.

2. Discussion of Related Art

The spreading of liquid on non-absorbing surfaces is determined by various parameters such as the surface free energy (i.e., its wetting properties), the surface morphology (i.e., smooth or porous), and the ink surface tension. For example, FIG. 1A illustrates a surface 70 having a low surface energy with respect to the applied liquid, resulting in the rejection of the liquid by the surface, as illustrated in the formation of liquid drops 85A exhibiting a contact angle $\theta \gg 90°$. In case the liquid is water, the surface is considered hydrophobic. In this case, it is difficult to create a stable connection of the liquid to the surface. In another example, FIG. 1B illustrates a surface 70 having a high surface energy with respect to the applied liquid, resulting in the wetting of the surface by the liquid, as illustrated in the formation of a liquid layer 85B on surface 70, exhibiting a contact angle $\theta \ll 90°$. In case the liquid is water, the surface is considered hydrophilic. In this case, it is highly problematic to control a drop and prevent it from spreading.

When printing with the same printing liquid on a multi-component surface comprising both hydrophilic porous surfaces (e.g., etched copper) and hydrophobic smooth surfaces (e.g., polyamide or glass epoxy), the drop spreading on both surfaces cannot be controlled. As illustrates in FIG. 2A, liquid drops 85A form on the hydrophobic surface while an uncontrollable liquid film 85B forms on the hydrophilic surface. In case wetting of the hydrophobic surface is improved by reducing the surface tension of the ink to be lower than the surface energy, the over-wetting of the hydrophilic surface is worsened and an unacceptably smeared and low coverage image results (smearing and low coverage are caused by the high surface energy and porosity of the hydrophilic surface). The hydrophilic surface is shown in FIG. 2A as a protrusion 71 from surface 70 to enhance lateral wetting and the fact that the edges of the metal image act as chromatographic surface and thus the capillary forces drag liquid up.

Relating specifically to digital printing on printed circuit boards (PCBs), current technologies apply the solder mask layer by spreading a viscous photoresist formulation on the PCB, partially drying the formulation, exposing the layer through a mask to radiation and etching away the exposed areas to yield the required pattern of solder mask. This process allows using a wide range of formulations and in particular using formulations of high viscosity. Such a formulation however is problematic when turning to digital printing of PCBs.

BRIEF SUMMARY

One aspect of the present invention provides a method comprising normalizing surface energies of a substrate composed of one or more materials and digitally printing a formulation adapted to the normalized surface energies, as well as respective production systems and resulting products.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIG. 3A schematically illustrates the differences in surface energies over the PCB in the prior art.

FIG. 3B schematically illustrates a PCB after the differential hydrophobization, according to some embodiments of the invention.

FIG. 3C schematically illustrates a SAM molecule, according to some embodiments of the invention.

FIG. 3D is a high level schematic illustration of a SAM-bound support, according to some embodiments of the invention.

DETAILED DESCRIPTION

Figure 1A:
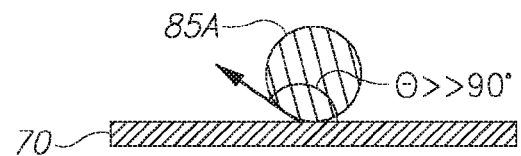
FIG. 1A illustrates a surface having a low surface energy with respect to the applied liquid, resulting in the rejection of the liquid by the surface.

Prior to setting forth the detailed description, it may be helpful to set forth definitions of certain terms that will be used hereinafter.

The term "substrate" as used in this application refers to any piece, made of one or more materials that may exhibit a single, multiple or a range of surface energies. For example, the term "substrate" may refer to printed circuit boards (PCB), micro-electro-mechanical systems (MEMS), wafers and wafer pieces, high density interposers, integrated circuits, advances substrates and substrates that comprise conducting areas (e.g., metals) and insulating areas (e.g., oxides, polymers).

The term "self-assembled monolayer (SAM)" as used in this application refers to a layer of molecules which are connected to a surface and are oriented more or less parallel to each other and more or less perpendicularly to the surface (the terms parallel and perpendicular are understood here in a qualitative way and are not to be strictly interpreted). The layer may be more or less organized, depending on various application parameters. Commonly, SAM molecules comprise an $\alpha$ group which binds to the surface at one end and a functional $\omega$ group at its other end. The SAM molecules in a formulation may belong to one or more chemical species, may, but must not, be aliphatic and the SAM layer may in certain cases comprise additional chemical species with the layer.

The terms "formulation", "ink", "glue", "support material" or "liquid" as used in this application refers to any liquid that may be used in a printing process. For example, the term "ink" may refer to water based and/or solvent based compositions and to compositions based on organic (e.g., polymeric) or inorganic solvents. The term "glue" may refer to any formulation usable as an adhesive or usable, after curing, as a support or cover.

The term "normalize" as used in this application refers to changing a distribution of surface energies of a substrate composed of one or more materials in a way that enables printing a given ink thereupon. In case of a substrate composed of a single material, the term "normalize" refers to a uniform change of the surface energy, while in case of a substrate composed of several materials, the term "normalize" refers to narrowing the differences in the surface energies of the materials to a level that enables printing a single ink thereupon.

The term "solder mask" as used in this application refers to an insulating layer applied to a surface of a PCB. In particular, the solder mask is commonly applied to insulate copper tracks on the PCB surface to avoid unintended electrical connections and to protect the copper from oxidation.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

Figure 1B:
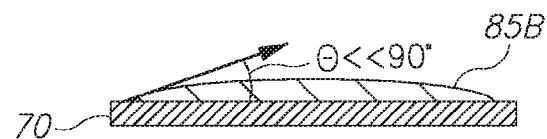
FIG. 1B illustrates a surface having a high surface energy with respect to the applied liquid, resulting in the wetting of the surface by the liquid.
Figure 2A:
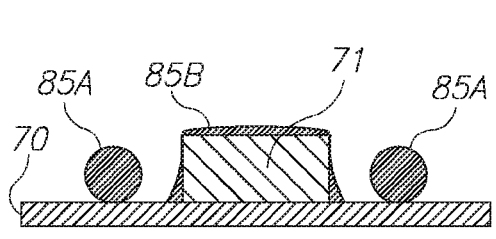
FIG. 2A illustrates a result of printing with the same printing liquid on a multi-component surface comprising both hydrophilic porous surfaces and hydrophobic smooth surfaces.
Figure 2B:
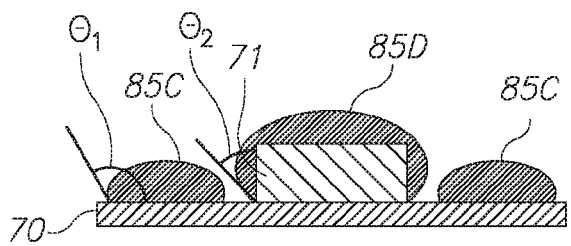
FIG. 2B schematically illustrates ink behavior on a substrate after differential hydrophobization pretreatment, according to some embodiments of the invention.

Without being bound by theory, certain embodiments of the invention propose an approach to printing on substrates that are composed of multiple materials. This approach involves a normalization of the surface characters, in particular of the surface energy of the substrate to preset the printing liquid with a more uniform surface exhibiting a narrower spread of surface energies which enable a more uniform wetting by the liquid. For example, FIG. 2B illustrates normalized substrate 70 (with normalized protrusion 71), wetted by the liquid in a more uniform manner than in FIG. 2A. In particular, the contact angles of the liquid with the substrate are intermediate between angles presented in FIGS. 1A and 1B, and good contact is achieved on surface 70 by liquid drops 85C exhibiting a contact angle $\theta_1$ and on protrusion 71 by liquid drops 85D exhibiting a contact angle $\theta_2$. In particular it should be noted that neither liquid repulsion nor extreme wetting are presented by any of the substrate's materials. Substrate 70 may comprise, as non-limiting examples, copper 90, wafer material 91 (e.g., silicon or any other material the wafer is made of) and glass epoxy 85 presented below. Clearly, substrate 70 may comprise any material or combination of materials, relating e.g., to printed circuit boards (PCB), micro-electro-mechanical systems (MEMS), wafers or wafer pieces, high density interposers, integrated circuits, advances substrates and substrates that comprise conducting areas (e.g., metals) and insulating areas (e.g., oxides, polymers).

Figure 2C:
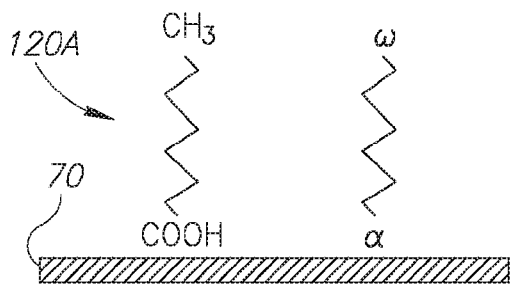
FIG. 2C schematically illustrates pretreatment molecules, according to some embodiments of the invention.

In certain embodiments, the normalization of the substrate's surface energies may be achieved by applying an intermediate layer 120 (see FIG. 3B below) using physical or chemical attachment mechanisms. For example, physical attachment may be achieved by non-bonding interactions between the substrate and molecules 120A of intermediate layer 120, e.g. electric interactions with acidic groups (see FIG. 2C). Physical treatment may yield uniform surface energy of the treated substrate or may allow some variability on the surface energies. In another example, chemical attachment may be achieve by selectively binding molecules 120A of intermediate layer 120 to one or more materials of the surface of substrate 70. For example, a trichlorosilane group at the α position may be used to bind silicon or any other material the wafer is made of, a thiol group at the α position may be used to bind copper etc. The selectivity of the chemical reaction enables changing the surface energy of areas with one substrate material to about the surface energy of areas with another substrate material. For example, the range of the surface energies exhibited by the treated substrate may be reduced from tens of dynes per cm down to 15 dyne/cm, less than 15 dyne/cm, less than 10 dyne/cm, less than 5 dyne/cm etc.

The liquid may be selected according to the range of normalized surface energies to achieve a specified range of contact angles to the treated substrate (e.g., the liquid may be thinned or thickened, the solvent may be properly selected, additives may be introduced etc.). For example, the liquid and/or the normalizing treatment may be selected to achieve contact angles around 90°, smaller than 90°, smaller than 60°, smaller than 45° etc. between the liquid and the treated substrate.

In addition, the free end of molecules 120A of intermediate layer 120, the ω group, may be utilized to selectively contact ink molecules. For example, in case of an ink that undergoes a polymerization reaction upon solidification, the ω group may be to participate in the polymerization reaction, and thus stabilize the printed ink onto the substrate. Particularly in the case of chemical treatment, intermediate layer 120 may bridge between the ink and the substrate by covalent bonds which ensure good adhesion.

In certain embodiments, intermediate layer 120 may comprise amphiphilic molecules 120A having a polar α group such as amine (—$NH_2$), trichlorosilane (—$SiCl_3$), thiol (—SH) or carboxylic (—COOH) group, and a non-polar/partially polar ω group such as nitrile (—CN), ethyl (—$CH_2$) or methyl (—$CH_3$) as non-limiting examples. Such amphiphilic groups may physically or chemically attach to the substrate with the polar α group and leave the ω group to determine the surface energy presented to the applied liquid. In certain embodiments, such attachment creates an intermediate, monomolecular layer that has uniform wetting properties, and enables controlling drop size of a single ink on substrate areas made of different materials. For example, good wetting properties and promoted adhesion of a polymerized ink onto the surface may be achieved by using an amphiphile having a double bond at the ω position. In this example, intermediate layer 120 functions both to normalize the surface energy of the substrate (before ink solidification) and to promote ink adhesion by taking part in the polymerization reaction (e.g. photochemical or thermal curing) and creating a covalent bonding between the ink and the amphiphile.

Figure 4:
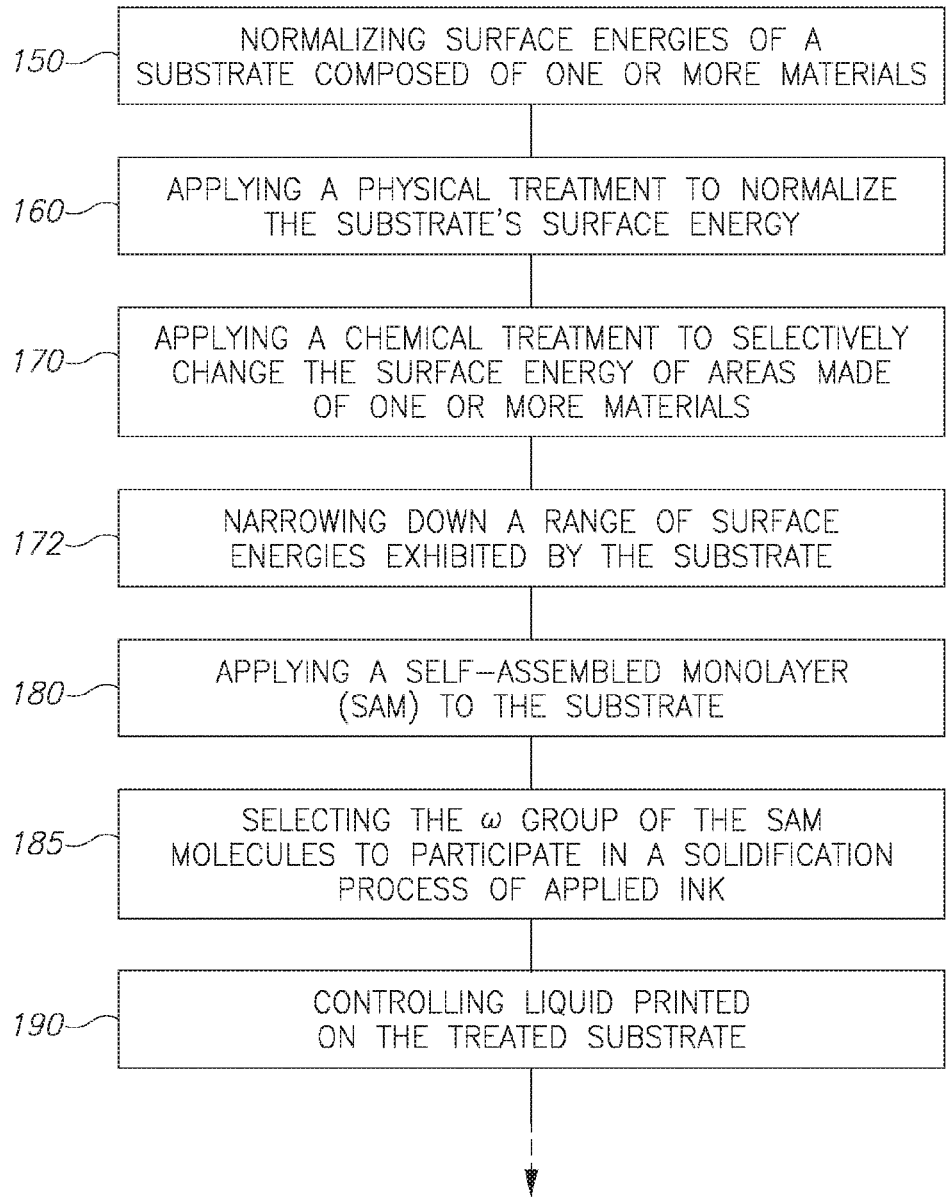
FIG. 4 is a high level schematic flowchart of a method, according to some embodiments of the invention

As illustrated in FIG. 4 below, certain embodiments of the invention comprise a substrate treatment method 200 comprising any of the following stages: normalizing surface energies of a substrate composed of one or more materials (stage 150), applying a physical treatment to normalize the substrate's surface energy (stage 160), applying a chemical treatment to selectively change the surface energy of areas made of one or more materials (stage 170), to narrow down a range of surface energies exhibited by the substrate (stage 172). Any of these stages may be used to control liquid printed on the treated substrate (stage 190). In particular, the chemical treatment may comprise applying a self-assembled monolayer (SAM) to the substrate (stage 180) and selecting the ω group of the SAM molecules to participate in a solidification process of applied formulation (stage 185).

In certain embodiments, a method is provided that may include: (i) coating/printing a multi component surface that may include both hydrophilic portions and hydrophobic portions with monomolecular surface, (ii) printing a liquid formulation (such as a solder ink, legend ink, glue or support material). Either one of stages (i) and (ii) may be followed or include photochemical or thermal curing, UV treatment and the like. In certain embodiments, a system is provided that may include: (i) a treatment unit such as a first coating/printing module for printing/coating a multi component surface that may include both hydrophilic portions and hydrophobic portions with monomolecular surface, the treatment unit arranged to apply an intermediate layer to a substrate composed of one or more materials, the intermediate layer configured to normalize surface energies of the substrate; and (ii) a printing unit such as a second coating/printing module for printing a liquid formulation (such as a solder ink, legend ink, glue or support material). The printing unit is arranged to digitally print a formulation adapted to the normalized surface energies upon the treated substrate. Either one of first and second printing/coating modules may include a curing/heating/radiating module for photochemical or thermal curing, UV treatment, heat treatment and the like. It is noted that the coating/printing module may be separated from curing module or proximate to such coating/printing modules. Each printing/curing module may include one or more inkjets or any other components capable of coating and/or printing.

EXAMPLE 1

As a non-limiting example, an application of printing a solder mask on a PCB (as examples for liquid ink 85 and substrate 70, respectively) is presented in the following. In this non-limiting example, a chemical treatment is applied to substrate 70 that selectively binds and lowers the surface energy of the conducting copper tracks.

In contrast to current technologies, which apply the solder mask layer by spreading a viscous photoresist formulation on the PCB, in digital ink jet printing technology, the solder mask in its final pattern is printed directly on the PCB. Such processes are much shorter than the current technologies and allow a more rapid production of PCBs. The main challenge of digital printing of solder mask is to achieve an accurate and stable printing of the solder mask layer with high rate adhesion to the surface of the substrate. This challenge the following combination of requirements:

1. A reduction of two to three orders of magnitude in the formulation's viscosity, as the ink jet printing process significantly limits the viscosity of the formulation. A too viscous formulation cannot be efficiently printed.
2. The printing must be very accurate in its ink deposition upon the PCB. While in current technologies the solder mask is allowed to be partially dried before the patterning step, in ink jet printing each drop must be accurately set and remain in its position.
3. The challenges set by requirements 1 and 2 are compounded by the fact that metals, such as copper tracks on the PCB, have a high surface energy, which makes it difficult to accurately place an ink drop having a relatively low viscosity and low surface tension.
4. The surface of the PCB includes materials of very different surface energies. For example, thin tracks of copper (high surface energy) are placed between areas of glass epoxy (low surface energy). A printed ink drop (of relatively low viscosity and low surface tension) behaves very differently on such materials and thus accurate drop positioning is hindered.

FIG. 3A schematically illustrates these difficulties of the prior art. Ink 85 applied to a PCB 100 (as substrate 70) builds stable drops 85C on glass epoxy 80 (e.g. having a contact angle larger than 90°, when ink 85 is selected to adhere well to glass epoxy layer 80), which has a low surface energy, but spreads 85B on copper 90, which has a high surface energy. The spreading of the ink and the non-uniform wetting disables accurate printing.

These challenges are solved by embodiments of the invention in the following ways: First, embodiments of the invention introduce a dot control mechanism by applying differential hydrophobization to the surface, to reduce the differences in surface energy over the surface of the PCB and make the surface more uniform (in its hydrophobicity and hence wetting character) for ink jet printing. Second, embodiments of the invention improve ink adhesion to the copper tracks, by selecting the ω groups to covalently bind to the ink during its curing. These solutions are explained in detail in the following.

Differential hydrophobization is carried out by selectively applying a self-assembled monolayer (SAM) to the copper, to reduce its surface energy. The SAM molecules are selected to covalently bind (via an α group) to the copper and not to the glass epoxy, and to be hydrophobic, i.e. to have (via an ω group) a lower surface energy which is closer to the surface energy of the glass epoxy. For example, SAM molecules may have thiol α groups and doubly bound ω group, with a linear aliphatic skeleton connecting the α and ω groups. The SAM may be applied to the PCB by immersion in a liquid, during which only the copper covalently binds to the α groups of the SAM.

FIG. 3B schematically illustrates PCB 100 after the differential hydrophobization, according to some embodiments of the invention. SAM 120 covalently binds to copper 90, and reduces its surface energy. As a result, the wetting of the PCB is more uniform (with respect to the situation illustrated in FIG. 3A) and stable drops of ink (e.g., solder mask) are formed all over PCB 100, over both glass epoxy 80 (85C) and copper 90 (85D), enabling accurate printing.

As a result, the solder mask may be printed accurately over the whole surface of the PCB, having a relatively spatially-uniform surface energy.

Ink adhesion to the copper tracks is improved by selecting the ω groups to covalently bind to the ink during its solidification (e.g. by thermal curing, ultraviolet curing or any other solidification mechanism). For example, the ω group may comprise a double bond or an epoxide which participate in the solidification reaction of the ink. For example, double bonds as reactive a) groups may participate in a radical polymerization of the ink. The ω groups may be selected FIG. 3C schematically illustrates a SAM molecule, according to some embodiments of the invention. The SAM molecules may have an α group that covalently binds to copper 90 and an ω group that covalently binds to ink 85 during solidification thereof.

Hence, the SAM acts as a bridging layer, which enhances adhesion of the ink to the copper via covalent bonding. The SAM may thus compensate for the lower viscosity of the ink and enable effective printing of the solder mask pattern.

EXAMPLE 2

As a non-limiting example, an application of glue as support material, e.g., upon a wafer piece, is presented in the following. The SAM molecules may comprise a wafer binding α group and a hydrophobic ω group. A formulation may be applied onto the SAM and the ω group may be selected to covalently bind the formulation upon solidification thereof. The solidified formulation may be used as a support or as a cover for different purposes.

FIG. 3D is a high level schematic illustration of a SAM-bound support 110, according to some embodiments of the invention. Support 110 may comprise the solidified formulation bound by SAM 120 to a wafer piece 91 (substrate 70). SAM 120 acts as a bridging layer, which enhances adhesion of supporting formulation 110 to wafer piece 91 via covalent bonding. By providing a strong connection to the supporting formulation, support or cover 110 may be stabilized upon surface 90. For example, SAM application may replace or enhance gluing a piece of wafer material on top of a wafer piece, or serve to produce a cover made of the solidified formulation. To assure adhesion, SAM 120 is applied onto wafer piece 91. The SAM molecules are selected to have a wafer-binding α group and a formulation-binding ω group. For example, the α group may be trichlorosilane (and bind silicon as one of the possible wafer materials) and the ω group may comprise a double bond or an epoxide which participate in the solidification reaction of the protective formulation. For example, double bonds as reactive ω groups may participate in a radical polymerization of the formulation.

FIG. 4 is a high level schematic flowchart of a method 200 according to some embodiments of the invention. In certain embodiments, method 200 comprises applying differential hydrophobization to the PCB surface (stage 210) to reduce the surface energy of copper on the PCB (stage 220) and thereby control printed dots by evening out the surface energies of different PCB surface components (stage 215). Method 200 may be applied to printing any kind of formulation, e.g., ink or glue.

In certain embodiments, method 200 comprises applying a self-assembled monolayer (SAM) to the PCB surface (stage 230), to selectively apply the SAM to copper (stage 232), thereby reducing the copper's surface energy (stage 220). A solution of the SAM molecules may be applied to the PCB as a whole, and the SAM molecules may specifically bind to the copper tracks at their α group and stay on the PCB surface after washing the solution. In certain embodiments, method 200 may comprise controlling the selectivity by selecting the α group of the SAM molecules to bind to copper (stage 235). For example, method 200 may comprise selecting the α group of the SAM molecules to bind to copper and not to glass epoxy (stage 237) (or bind only to copper), selecting the α group of the SAM molecules to bind to copper covalently (stage 239) and/or selecting the α group of the SAM molecules to be a thiol (stage 241).

The SAM molecules may comprise a copper binding α group and a hydrophobic ω group. Method 200 may comprise selecting the ω group of the SAM molecules to be hydrophobic (stage 245), selecting the ω group of the SAM molecules to bind to the ink covalently upon solidification (stage 255) and/or selecting the ω group of the SAM molecules to be a double bond or an epoxide (stage 260).

For example, the ω group may be selected to shrink the surface energy gap between the glass epoxy and the copper (being in the untreated state tens of dynes/cm, e.g. higher than 70 dyne/cm) to less than 15 dyne/cm for the treated PCB, with the copper-bound SAM. In certain embodiments, the surface energy gap between the glass epoxy and the treated copper may be reduced below 10 dyne/cm or below 5 dyne/cm, and provide contact angles with the ink which are smaller than 90°, smaller than 60°, smaller than 45°, and in any case, providing good adhesion of the ink to all areas of the PCB.

Method 200 may thus improve ink adhesion by covalent bonding between the ω groups of the SAM molecules and the ink (stage 250), and may further comprise printing a solder mask ink onto the PCB (stage 265) and solidifying the ink to covalently bind to the SAM (stage 270).

The SAM molecules, and in particular their ω groups, may be selected according to specific ink parameters such as ink components, available binding mechanisms and solidification mechanisms. For example, the ω groups may be selected to bind specified solder mask inks.

In certain embodiments, the SAM may comprise a mixture of several types of molecules which are selected to bind to different components on the PCB surface and/or to different components in the ink.

Certain embodiments of the invention further comprise PCBs prepared according to any of the above mentioned methods and the use of SAM in the above described methods. Embodiments of the invention further comprise systems for manufacturing of the PCB's and the respective preparation methods.

Certain embodiments of the invention further comprise PCBs 100 comprising SAM 120, wherein the SAM molecules comprise a copper binding α group that binds selectively to copper of the PCB surface and a hydrophobic ω group that binds to the solder mask ink upon solidification thereof. Embodiments of the invention further comprise methods of applying a solder mask to a PCB, comprising applying a SAM to the PCB and digitally printing solder mask ink thereupon. For example, the PCB may be immersed in a liquid comprising the SAM molecules, cleaned from residual liquid (with the SAM molecules binding to the copper on the surface of the PCB and not being removed) and then receive the solder mask by a digital printing process. The SAM may participate in the solidification process of the ink to ensure the stability of the solder mask.

In certain embodiments, method 200 further comprises binding a self-assembled monolayer (SAM) on a wafer piece (stage 280), applying the formulation onto the SAM (stage 287), and solidifying the formulation to covalently bind to the SAM and protect the defect (stage 295). The SAM molecules may comprise a wafer binding α group and a hydrophobic ω group.

In certain embodiments, method 200 further comprises selecting an α group of the SAM molecules to covalently bind to the wafer material (stage 285), e.g. a trichlorosilane (for binding silicon or any other material the wafer is made of), and selecting an ω group of the SAM molecules to covalently bind to the formulation upon solidification thereof (stage 290), e.g. selecting the ω group of the SAM molecules to be a double bond or an epoxide (stage 292).

Certain embodiments of the invention further comprise wafer pieces prepared according to any of the above mentioned methods and the use of SAM in the above described methods. Embodiments of the invention further comprise systems for preparing the wafer pieces and the respective preparation methods.

In the above description, an embodiment is an example or implementation of the invention. The various appearances of "one embodiment", "an embodiment", "certain embodiments" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and embodiments may incorporate elements from other embodiments disclosed above. The disclosure of elements of the invention in the context of a specific embodiment is not to be taken as limiting their used in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

I claim:

1. A method comprising normalizing surface energies of a substrate composed of one or more materials and digitally printing a formulation adapted to the normalized surface energies; wherein the normalizing is carried out by a physical treatment of the substrate with an intermediate layer of molecules having a polar α group selected to physically attach to a surface of the substrate and a ω group selected to present a specified surface energy to the formulation.

2. The method of claim 1, wherein the intermediate layer is a self-assembled monolayer.

3. A method comprising normalizing surface energies of a substrate composed of one or more materials and digitally printing a formulation adapted to the normalized surface energies; wherein the normalizing is carried out by a chemical treatment of the substrate with an intermediate layer of molecules having a polar α group selected to bind to at least one of the surface materials and ω group selected to present a specified surface energy to the formulation.

4. The method of claim 3, wherein the ω group is selected to participate in a solidification process of the formulation.

5. The method of claim 3, wherein the intermediate layer is a self-assembled monolayer.

6. The method of claim 3, wherein the substrate is a printed circuit board (PCB) and the intermediate layer is a self-assembled monolayer comprising copper binding α groups.

7. The method of claim 6, wherein the a group is a thiol, the ω group is selected from a double bond and an epoxide and the formulation is a solder mask.

8. The method of claim 6, further comprising printing a solder mask ink onto the PCB and solidifying the ink.

9. The method of claim 3, wherein the substrate is a wafer piece and the intermediate layer is a self-assembled monolayer comprising wafer binding α groups.

10. The method of claim 9, wherein the α group is a trichlorosilane and the ω group is selected from a double bond and an epoxide.

11. The method of claim 9, further comprising printing a formulation onto the wafer piece and solidifying the formulation.

12. A printed substrate comprising an intermediate layer selected to bridge between a substrate composed of one or more materials and a digitally printed formulation, wherein the intermediate layer is selected to normalize surface energies of the substrate and the formulation is adapted to the normalized surface energies; wherein the intermediate layer is physically attached to the substrate and comprises molecules having polar α groups selected to physically attach to a surface of the substrate and ω groups selected to present a specified surface energy to the formulation.

13. A printed substrate comprising an intermediate layer selected to bridge between a substrate composed of one or more materials and a digitally printed formulation, wherein the intermediate layer is selected to normalize surface energies of the substrate and the formulation is adapted to the normalized surface energies; wherein the intermediate layer is chemically bonded to at least one of the substrate materials by respective α groups and comprises ω groups selected to present a specified surface energy to the formulation.

14. The printed substrate of claim 13, wherein the ω group is selected to participate in a solidification process of the formulation.

15. The printed substrate of claim 13, wherein the substrate is a printed circuit board (PCB) and the intermediate layer is a self-assembled monolayer comprising copper binding α groups.

16. The printed substrate of claim 15, wherein the α group is a thiol, the formulation is a solder mask and the ω group is selected from a double bond and an epoxide.

17. A system comprising: a treatment unit arranged to apply an intermediate layer to a substrate composed of one or more materials, the intermediate layer configured to normalize surface energies of the substrate; and a printing unit arranged to digitally print a formulation adapted to the normalized surface energies upon the treated substrate; wherein intermediate layer comprises polar α groups selected to physically or chemically attach to a surface of the substrate and ω groups selected to present a specified surface energy to the formulation.

* * * * *